US009099178B2

(12) United States Patent
Zhang et al.

(10) Patent No.: US 9,099,178 B2
(45) Date of Patent: Aug. 4, 2015

(54) RESISTIVE RANDOM ACCESS MEMORY WITH ELECTRIC-FIELD STRENGTHENED LAYER AND MANUFACTURING METHOD THEREOF

(75) Inventors: Wei Zhang, Shanghai (CN); Lin Chen, Shanghai (CN); Peng Zhou, Shanghai (CN); Qingqing Sun, Shanghai (CN); Pengfei Wang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/457,035

(22) Filed: Apr. 26, 2012

(65) Prior Publication Data

US 2012/0305880 A1 Dec. 6, 2012

Related U.S. Application Data

(63) Continuation of application No. PCT/CN2011/002090, filed on Dec. 13, 2011.

(30) Foreign Application Priority Data

Jun. 3, 2011 (CN) .......................... 2011 1 01048588

(51) Int. Cl.
| | |
|---|---|
| *H01L 29/86* | (2006.01) |
| *H01L 27/24* | (2006.01) |
| *G11C 13/00* | (2006.01) |
| *H01L 45/00* | (2006.01) |

(52) U.S. Cl.
CPC ........ *G11C 13/0007* (2013.01); *H01L 27/2436* (2013.01); *H01L 45/04* (2013.01); *H01L 45/1233* (2013.01); *H01L 45/146* (2013.01); *H01L 45/1616* (2013.01); *G11C 2213/55* (2013.01)

(58) Field of Classification Search
CPC ... G11C 11/15; H01L 45/146; H01L 27/2463
USPC .................. 438/537, E27.006; 257/591, 537, 257/E27.006; 365/100, 148
See application file for complete search history.

(56) References Cited

U.S. PATENT DOCUMENTS

| | | | | |
|---|---|---|---|---|
| 7,977,152 | B2 * | 7/2011 | Gorer et al. .................... | 438/104 |
| 8,049,305 | B1 * | 11/2011 | Miller et al. ................... | 257/537 |
| 8,129,704 | B2 * | 3/2012 | Phatak et al. ..................... | 257/2 |
| 8,183,553 | B2 * | 5/2012 | Phatak et al. ..................... | 257/4 |
| 8,343,813 | B2 * | 1/2013 | Kuse et al. ..................... | 438/133 |
| 8,466,446 | B2 * | 6/2013 | Wang et al. ....................... | 257/4 |

(Continued)

*Primary Examiner* — George Fourson, III
(74) *Attorney, Agent, or Firm* — Jenkins, Wilson, Taylor & Hunt, P.A.

(57) ABSTRACT

This invention belongs to the technical field of memories and specifically relates to a resistive random access memory structure with an electric-field strengthened layer and a manufacturing method thereof. The resistive random access memory in the present invention can include a top electrode, a bottom electrode and a composite layer which is placed between the top electrode and the bottom electrode and have a first resistive switching layer and a second resistive switching and electric-field strengthened layer; the second resistive switching and electric-field strengthened layer cab be adjacent to the first resistive switching layer and have a dielectric constant lower than that of the first resistive switching layer. The electric-field distribution in the RRAM unit is adjustable.

6 Claims, 3 Drawing Sheets

(56) References Cited

U.S. PATENT DOCUMENTS

| | | | |
|---|---|---|---|
| 2008/0151466 A1* | 6/2008 | Simpson | 361/234 |
| 2010/0052072 A1* | 3/2010 | Li et al. | 257/380 |
| 2012/0020138 A1* | 1/2012 | Lue et al. | 365/63 |
| 2012/0049291 A1* | 3/2012 | Scheiper et al. | 257/380 |
| 2012/0178953 A1* | 7/2012 | Ma et al. | 556/53 |
| 2012/0181584 A1* | 7/2012 | Huang et al. | 257/288 |
| 2012/0305880 A1* | 12/2012 | Zhang et al. | 257/4 |
| 2014/0073107 A1* | 3/2014 | Wang et al. | 438/382 |

\* cited by examiner

RESISTIVE RANDOM ACCESS MEMORY WITH ELECTRIC-FIELD STRENGTHENED LAYER AND MANUFACTURING METHOD THEREOF

CROSS-REFERENCE TO RELATED APPLICATIONS

This application is a continuation of and claims priority to PCT/CN2011/002090 filed Dec. 13, 2011, which claims priority to Chinese Patent Application No. 201110148588.1 filed on Jun. 3, 2011, the entireties of which are both hereby incorporated by reference.

BACKGROUND OF THE INVENTION

1. Technical Field

The present invention belongs to the technical field of non-volatile memories and relates to a resistive random access memory structure and a manufacturing method thereof, in particular to a resistive random access memory structure with an electric-field strengthened layer and a manufacturing method thereof.

2. Description of Related Art

Along with the continuous scaling of the integrated circuits, the traditional flash non-volatile memories cannot be shrinked limitlessly as in the development of integrated circuit technology, and the flash memory process is having difficulty breaking through the bottleneck of 45 nm; besides, dynamic and static memories are susceptible to data loss after power failure. In recent years, rapid progresses have been made in various new non-volatile memories, for example: ferroelectric random access memories (FRAM), magnetic random access memories (MRAM), phase-change random access memories (PRAM) and resistive random access memories (RRAM).

Among those memories, information reading and writing of the resistive random access memory is realized by reading or changing the resistance of the resistive switching materials. The resistive switching materials have a high-resistance and low-resistance state. RRAM stores information via the material switching between a high impedance state and a low impedance state. FIG. 1 illustrates a sectional view of a typical RRAM. In this RRAM unit 100, a resistive switching storage layer 102 is located between a top electrode 101 and a bottom electrode 103. The top electrode 101 and the bottom electrode 103 are usually made of metal materials such as Pt and Ti with stable chemical properties, and the resistive switching storage layer 102 is usually made from binary or ternary metallic oxides such as $TiO_2$, $ZrO$, $Cu_2O$ and $SrTiO_3$. The resistance of the resistive switching storage layer 102 is capable of being switched between two states, namely a high impedance state and a low impedance state, which can be represented by "0" and "1" respectively, by the action of external voltage. By the effect of different external voltages, the resistance of the resistive random access memory is capable of being switched between the high impedance state and the low impedance state, to realize information storage.

Along with the further development of integrated circuit technology, a great amount of materials with resistive switching properties have been reported in succession, such as $SiO_2$, NiO, $Cu_xO$, $TiO_2$, $HfO_x$ and $ZrO_x$. RRAM has attracted great attention because of its advantages such as simple preparation, high storage density, low operation voltage, high reading speed, long keeping time, non-destructive reading, low power consumption, and high compatibility with the traditional CMOS process; and therefore is taken as one of the high-quality candidates for the next "universal" memory.

The stability of the working performance of RRAM, comprising the stability of the writing and erasing voltages and the stability of the signal intensity ratio of the high impedance to the low impedance, is the key factor to make RRAM practical. Usually, RRAM faces the major problems of unstable erasing voltage and unstable erasing current. Therefore, seeking methods for preparing the highly stable RRAM with optimized performance has become a key measure for allowing RRAMs to be applied in the industry.

BRIEF SUMMARY OF THE INVENTION

This invention aims to provide a highly stable resistive random access memory (RRAM) with optimized performance for industrial application.

In the RRAM provided by the present invention, a laminated layer consisting of resistive switching materials with different dielectric constants is used as a resistive switching storage layer, comprising a top electrode, a bottom electrode and a laminated layer which is placed between the top electrode and the bottom electrode and consists of a first resistive switching layer and a second resistive switching and electric-field strengthened layer.

The second resistive switching and electric-field strengthened layer is adjacent to the first resistive switching layer and has a dielectric constant lower than that of the first resistive switching layer.

The second resistive switching and electric-field strengthened layer is capable of being made from a material with a relatively low dielectric constant, for example $SiO_2$, $Al_2O_3$, etc.; and the first resistive switching layer is capable of being made from a material with a relatively high dielectric constant, for example, $HfO_2$, $ZrO_2$, $Nb_2O_5$ or mixtures thereof.

Meanwhile, this invention also provides a method for manufacturing the RRAM, comprising:

forming a bottom electrode of the RRAM on the substrate;

forming a first resistive switching layer on the bottom electrode;

forming a second resistive switching and electric-field strengthened layer on the first resistive switching layer for adjusting the electric field;

and forming a top electrode for the RRAM on the resistive switching and electric-field strengthened layer.

Furthermore, the bottom electrode is made of a metal material such as Pt/Ti, Au/Ti, TiN, Ru or Cu. The first resistive switching layer is made from a material with a high dielectric constant, such as $HfO_2$, $ZrO_2$, $Nb_2O_5$, or mixtures thereof. The second resistive switching and electric-field strengthened layer is made from a material with a low dielectric constant such as $SiO_2$, $Al_2O_3$, etc. The top electrode is made from a metal material such as Al, Pt, Ru, TiN, or TaN.

The traditional RRAM usually comprises an upper electrode, a resistive switching layer, and a lower electrode. In the present invention, a resistive switching and electric-field strengthened layer are also placed between the upper electrode and the lower electrode for strengthening the electric field in the resistive switching layer. Under the condition that a voltage is applied to the two ends of the stacked structures made from the oxide materials with different dielectric constants, the voltage dividing capabilities of the dielectric layers with different dielectric constants are different, which leads to differences of electric field distribution in the dielectric fields. Therefore, the aim of adjusting the electric field distribution in a RRAM unit is capable of being fulfilled by selecting resistive switching materials with different dielectric constants to compose the stacked layer structure, and then the control over the structure and number of the conductive channels formed in the switching process of the RRAM is realized by controlling the electric field distribution in the RRAM unit. When the dielectric constant of the second resistive switching and electric-field strengthened layer is lower than that of the first resistive switching layer, the electric field in the second resistive switching layer can be strengthened. Therefore, the electric field in the second resistive switching layer can be adjusted via the dielectric constants and thicknesses of the different layers.

In the present invention, the traditional film making method is adopted in the manufacturing of the RRAM structure with adjustable electric-field distribution, so the problem of unstable performance of the RRAM in practical use is solved in the laboratory and in theory.

OPTIMAL EMBODIMENT OF THIS INVENTION

The invention is further described in detail by combining the attached drawings and the embodiments. In the figure, to facilitate description, the layer thickness and region thickness are amplified, but the sizes do not represent the actual dimensions. The figures fail to reflect the actual dimensions of the device accurately, but show the mutual positions of the regions and the structures, especially the vertical and horizontal neighborhood of the structures.

Figure 1:
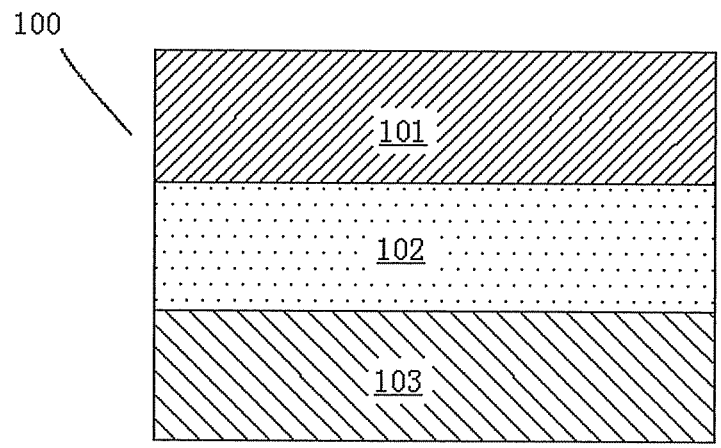
FIG. 1 is a sectional view of a typical prior art RRAM structure.
Figure 2:
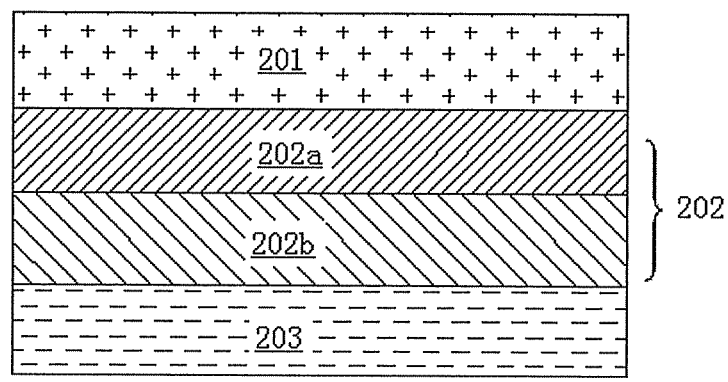
FIG. 2 is a sectional view of a typical RRAM structure according to one of the embodiments of the present invention.

FIG. 2 is a sectional view of a typical RRAM structure with controllable performance provided by the present invention. As shown in FIG. 2, the RRAM comprises a top electrode 201, a bottom electrode 203 and a composite dielectric layer 202 placed between the top electrode 201 and the bottom electrode 203, the composite dielectric layer 202 comprises a first resistive switching layer (usually made from a material with a high dielectric constant (high k) 202b and a second resistive switching and electric-field strengthened layer (usually made from a material with a low dielectric constant (low k) 202a). The material with the dielectric constant higher than that of the silicon dioxide is high-dielectric-constant material, and the material with the dielectric constant lower than that of the silicon dioxide is low-dielectric-constant material in this invention, the silicon dioxide is classified into the low-dielectric-constant materials.

The RRAM provided by the invention is capable of being integrated in semiconductor devices with different structures. The following description refers to the manufacturing process flow of one embodiment for integration of the RRAM in the MOSFET's rear interconnection process.

Figure 3:
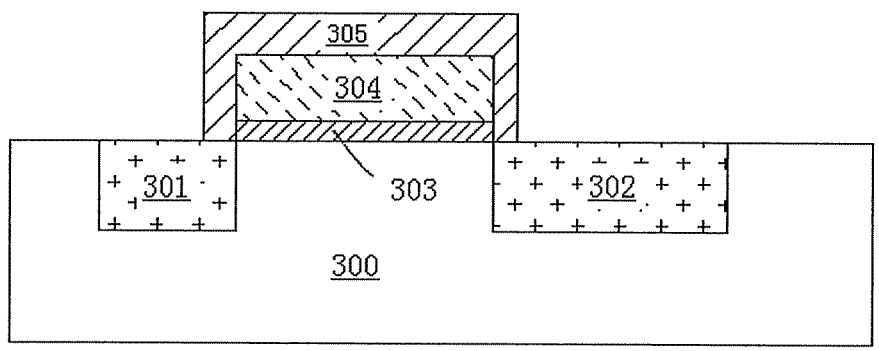
FIGS. 3 to 7 illustrate a process flow of one embodiment for manufacturing the RRAM as shown in FIG. 2 in the MOSFET's real interconnection process.

First, provide a silicon substrate 300, adopt the standard CMOS process to complete the front-end processes of the CMOS device, wherein a shown in FIG. 3, the specific process comprises: 1. forming a source region 301 and a drain region 302 in the silicon substrate 300 by means of a diffusion process or an ion injection process; 2. forming a gate oxide layer 303, a gate electrode 304 and an insulation layer 305 of the device on the substrate 300 by means of an oxidation process, a film deposition process and lithography and etching processes, in which the insulation layer 305 isolates the gate region and the other conductors of the device.

Figure 4:
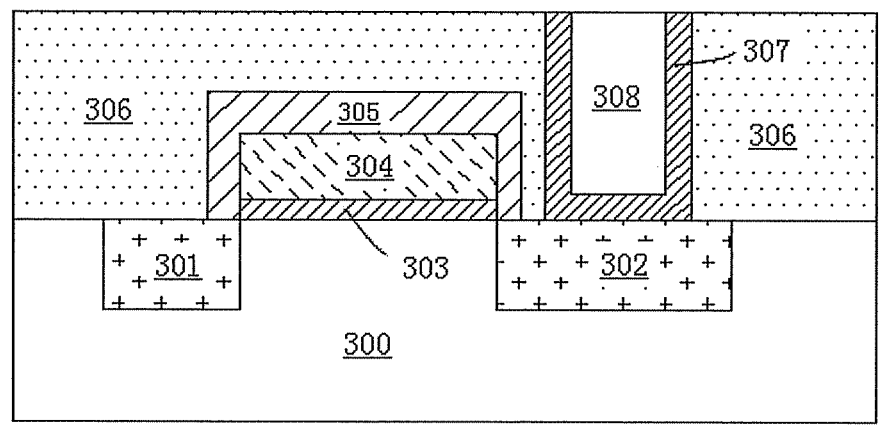

Second, deposit a low-k dielectric material by a chemical vapor deposition (CVD) process to form an isolation interlayer 306, lithography and etch to define the positions of the interconnection through holes, sputter a TiN layer which is used as a diffusion blocking layer by reacting ions, and grow a Ru layer on the TiN layer by the atom layer deposition (ALD) technology to form a Ru/TiN structure 307. Third, form a copper interconnection 308 by electroplating and plate the wafer surface by a chemically mechanical polishing (CMP) technology, as shown in FIG. 4.

Figure 5:
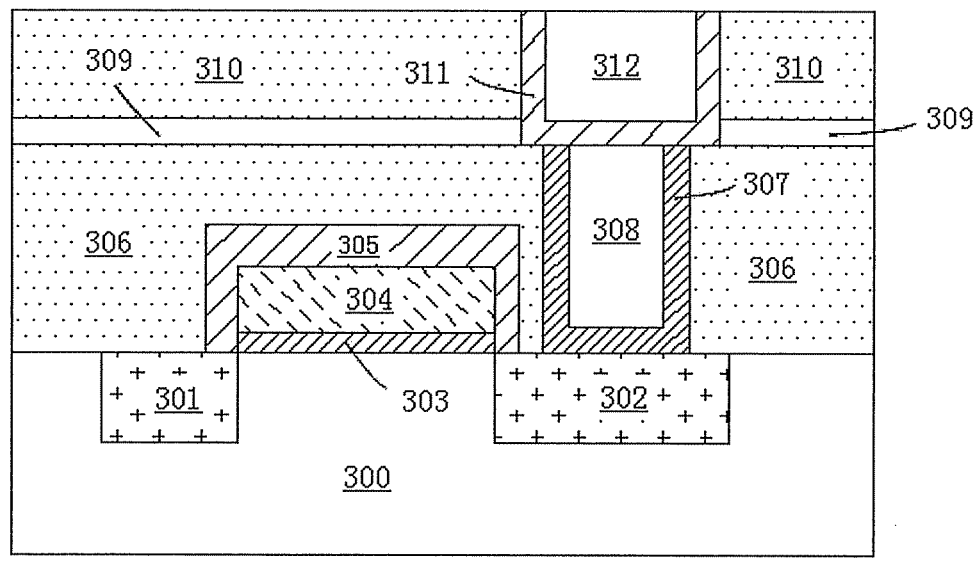

Fourth, deposit a silicon nitride etching blocking layer 309 and a SiOC insulation interlayer 310, lithography and etch to define the interconnection positions of the second layer, deposit a Ru/TiN diffusion blocking layer 311, electroplate the copper interconnection 312 and adopt the CMP technology for polishing, as shown in FIG. 5.

Fifth, place a sample into an atom layer deposition device, and heat the wafer to about 300° C. before the first pulse of the pulse period. Keep the temperature in the whole growth period of the ALD. Before the first pulse of the pulse period, set the pressure of the reactor at 1 Torr and maintain the pressure during the whole processing period.

Introduce the volatilizing gas from the hafnium organic reaction precursor Tetrakis (ethylmethylamino) hafnium (TEMAH) by using nitrogen gas as the gas carrier in the form of a pulse, wherein the pulse time is 2 s. Introduce the inactive gas in the form of a pulse into the reactor and remove the organic metal precursors which have not reacted and the by-products from the reactor. Remove the inactive gases including the nitrogen gas, the argon gas and the helium gas, wherein the pulse time is 3 s. Usually, introduce the vapor into the reactor within 1 to 2 s of the pulse duration. Remove unreacted vapor and the by-products from the reactor, wherein the pulse time is 3 s. Repeat the steps 100 times to obtain an $HfO_2$ high-k resistive switching layer 313 with a thickness of 10 nm.

Introduce the volatilizing gas from the liquid precursor trimethylamine (TMA) in a form of pulse into the reactor, wherein the pulse time is 1 s. Introduce the innert gas in the form of a pulse into the reactor and remove the unreacted organic metal precursors and the by-products from the reactor. Remove the inactive gases including the nitrogen gas, the argon gas and the helium gas, wherein the pulse time is 3 s. Introduce the vapor into the reactor with a pulse time of 1 s. Use the inactive gas pulse to remove unreacted vapor and the by-product from the reactor, wherein the pulse time is 3 s. Repeat the step for 15 times to obtain an $Al_2O_3$ low-k resistive switching layer 314 with a thickness of 2 nm.

Figure 6:
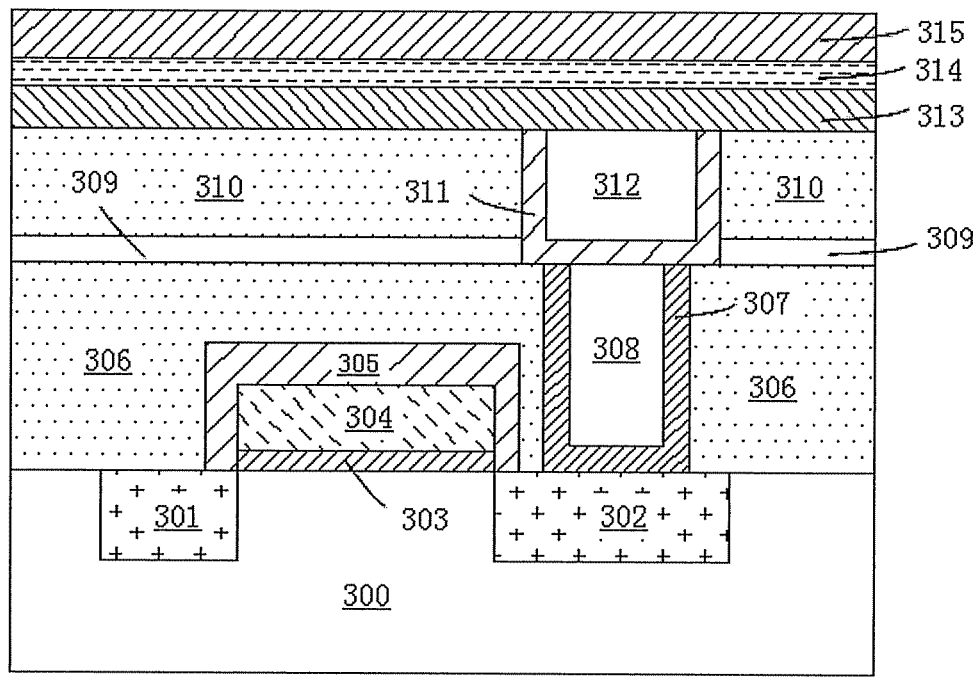

Sixth, grow TiN as the top electrode 315 on the grown high-k and low-k stacked layers by a physical vapor deposition process, as shown in FIG. 6.

Figure 7:
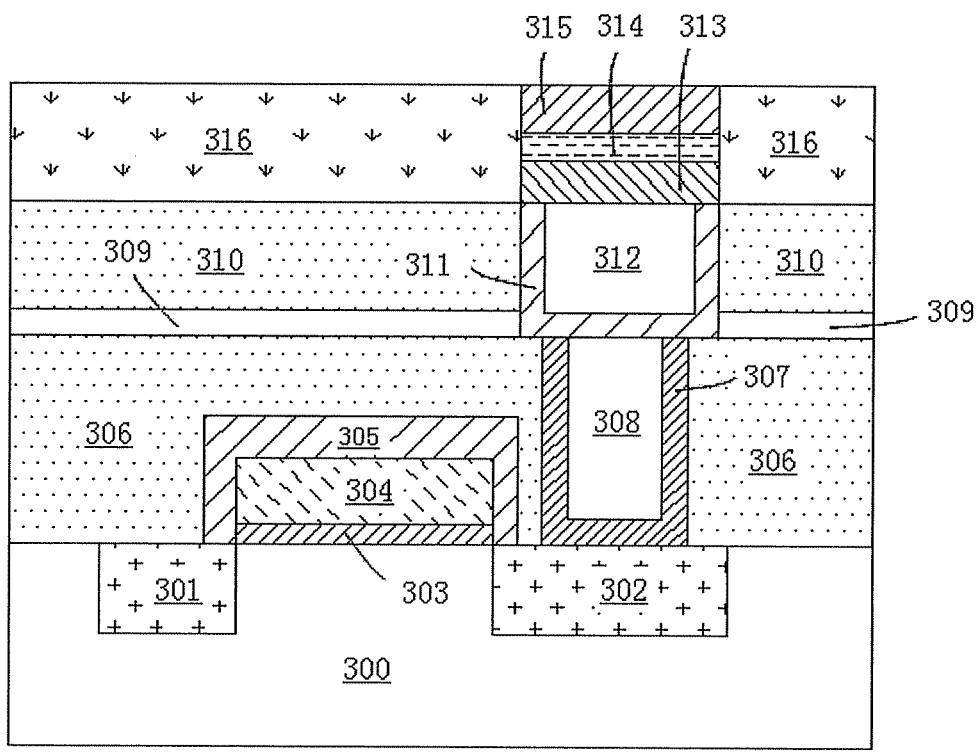

And seventh, use the lithography technology to define the pattern of the RRAM, etch the structure of the required RRAM and then grow an insulation layer 316 by CVD process, as shown in FIG. 7.

INDUSTRIAL APPLICATION

In the present invention, the traditional film making method is adopted in the manufacturing of the RRAM structure with the adjustable electric-field distribution, so the problem of unstable performance of the RRAM in practical use is completely solved in the laboratory and in theory.

As mentioned above, a plurality of embodiments with great differences may be constructed. It should be noted that, except those defined in the attached claims, the present invention is not limited to the embodiments in the description.

The invention claimed is:

1. A resistive random access memory comprising:
a semiconductor device; and
a composite switching layer integrated with the semiconductor device, the composite switching layer comprising:
 a first resistive switching layer comprising $Nb_2O_5$ having a first dielectric constant and a first thickness; and
 a second resistive switching and electric-field strengthened layer comprising $SiO_2$ having a second dielectric constant and a second thickness;
 wherein the second dielectric constant is less than the first dielectric constant; and
 wherein the first thickness is at least approximately 10 nanometers (nm), and wherein the second thickness is less than the first thickness.

2. The resistive random access memory of claim 1, wherein the semiconductor device comprises a complementary metal-oxide-semiconductor (CMOS) or a metal-oxide-semiconductor field-effect transistor (MOSFET) structure.

3. The resistive random access memory of claim 1, wherein the second resistive switching layer is approximately 2 nm thick.

4. A method for manufacturing the resistive random access memory (RRAM), comprising:
providing a semiconductor device; and
integrating a composite switching layer with the semiconductor device, the composite switching layer comprising:
 a first resistive switching layer comprising $Nb_2O_5$ having a first dielectric constant and a first thickness; and
 a second resistive and electric-field strengthened switching layer comprising $SiO_2$ or having a second dielectric constant and a second thickness;
 wherein the second dielectric constant is less than the first dielectric constant; and
 wherein the first thickness is at least approximately 10 nanometers (nm), and the second thickness is less than that first thickness.

5. The method for manufacturing the resistive random access memory of claim 4, wherein the semiconductor device comprises a complementary metal-oxide-semiconductor (CMOS) or a metal-oxide-semiconductor field-effect transistor (MOSFET) structure.

6. The method for manufacturing the resistive random access memory of claim 4, wherein the second resistive switching layer is approximately 2 nm thick.

* * * * *